Feb. 5, 1952

R. R. WINGERT 2,584,176

TELEVISION TUNER

Filed Oct. 28, 1949

2 SHEETS--SHEET 1

INVENTOR.

Raymond R. Wingert,

By Foorman L. Mueller Atty.

Feb. 5, 1952 R. R. WINGERT 2,584,176

TELEVISION TUNER

Filed Oct. 28, 1949 2 SHEETS—SHEET 2

INVENTOR.
Raymond R. Wingert,
BY
Norman L. Mueller
Atty.

Patented Feb. 5, 1952

2,584,176

UNITED STATES PATENT OFFICE 2,584,176

TELEVISION TUNER

Raymond R. Wingert, Chicago, Ill., assignor to Motorola, Inc., Chicago, Ill., a corporation of Illinois Application October 28, 1949, Serial No. 124,045

11 Claims. (Cl. 171—119)

This invention relates to television tuners, and particularly to variable-inductance means for such tuners.

Present television receivers operate in the very high frequency band extending from about 54 to 216 megacycles. Tuning inductances for operating at these frequencies are very small. Accordingly, when using the usual coil inductances the number of turns is very small and therefore construction of such units becomes very critical. It is therefore proposed to use a bar conductor for providing the desired coupling and tuning inductances, with these bar conductors being tapped so that various portions can be switched into the circuit. A tuner having this construction is disclosed and claimed in the copending application of George W. Fyler, Serial No. 743,700, filed April 24, 1947, now Patent Number 2,530,329, and the tuner of the present invention is an improvement of the tuner disclosed and claimed in said copending application.

An object of the present invention is to provide an improved tuner of the aforesaid description having a simpler, more compact and less expensive construction, and which will perform all of the functions of the prior tuner.

Another object is to provide an improved television tuner of the type described above in which all of the parts of the variable-inductance means are mounted directly on the switch wafers instead of being supported by auxiliary structure.

A feature of the invention is the provision of an improved tuner having an antenna circuit which includes tapped bus bars mounted on a stationary switch wafer, with suitable stationary contacts being arranged at the taps on these bus bars for cooperation with a rotary switch element.

Another feature is the provision of a variable-inductance element comprising an elongated arcuate segment on a stationary switch wafer having taps along its length, which taps cooperate with a rotary switch element, said segment being in series with coiled conductor sections on the stationary wafer that also have taps cooperating with the rotary element of the switch.

Figures 1, 2, 3, 4, 5:
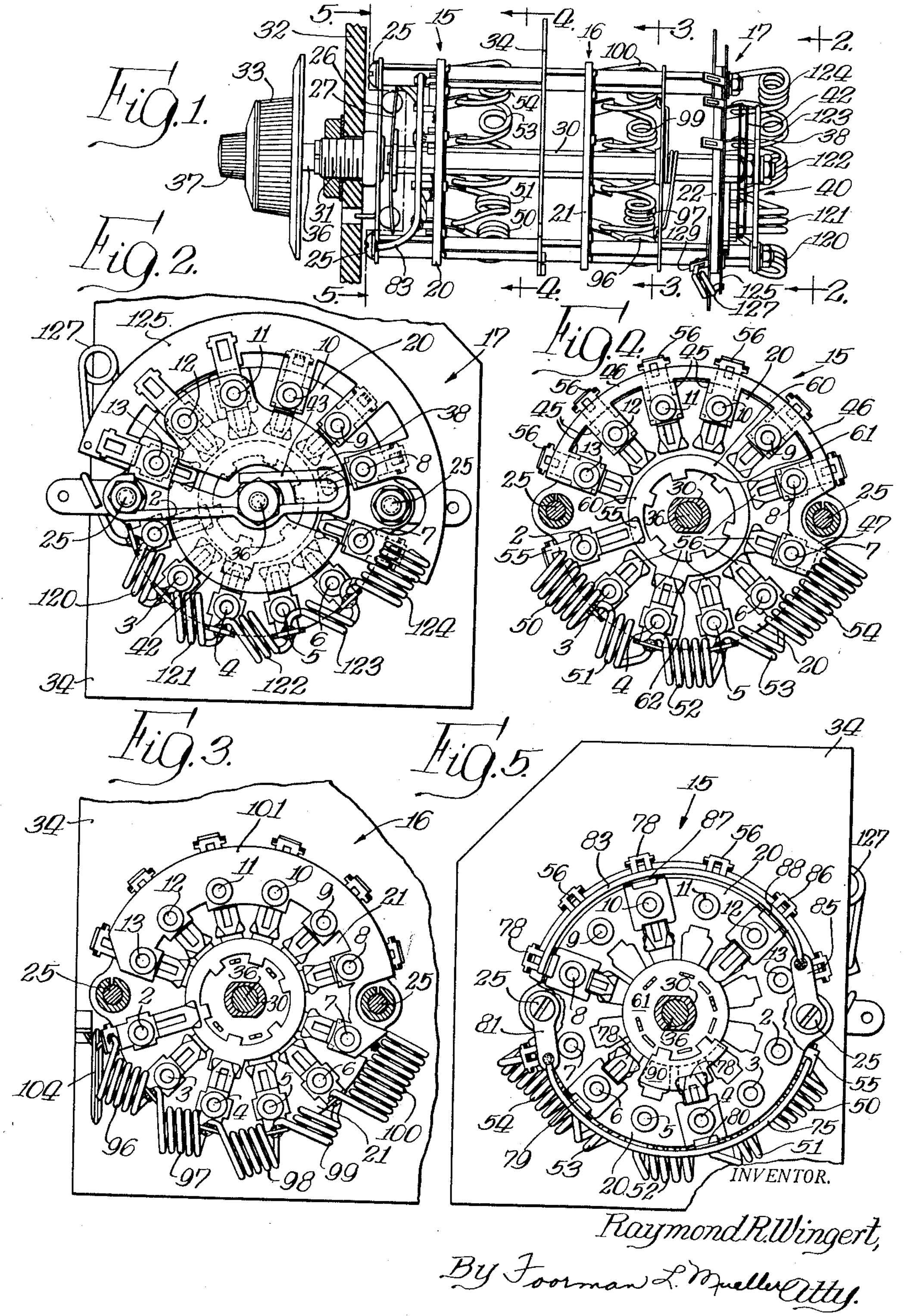
Figure 6:
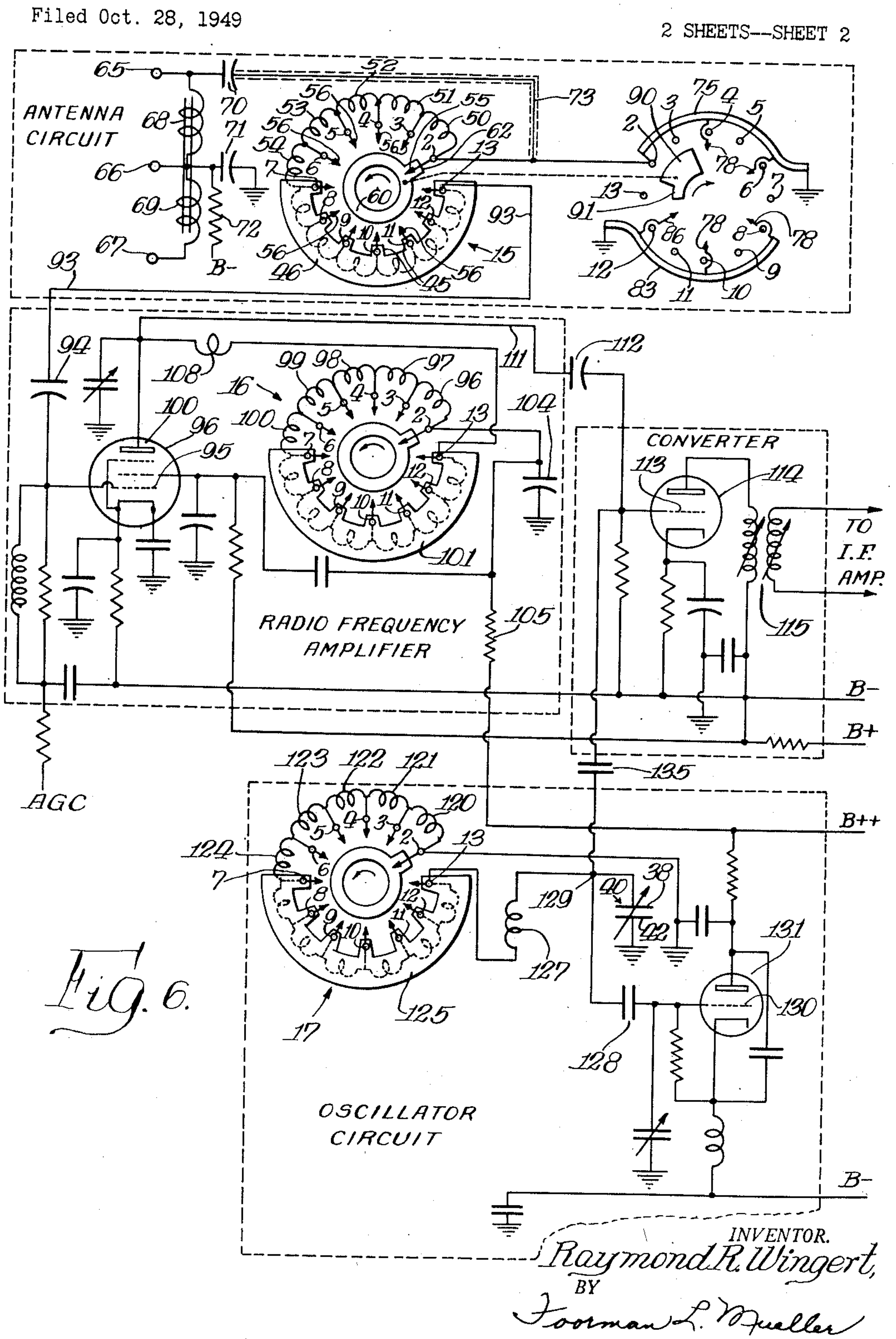

The foregoing and other objects and features of the invention will be understood better from the following detailed description taken in connection with the accompanying drawings, wherein:

Fig. 1 is a plan view of a television tuner constructed in accordance with and embodying the principles of the invention;

Figs. 2, 3, 4 and 5, respectively, are cross-sectional views taken on the lines 2—2, 3—3, 4—4 and 5—5 in Fig. 1; and Fig. 6 is a circuit diagram representing a portion of a television receiver in which this tuner is embodied.

The tuner which is herein disclosed employs a three-section rotary switch for simultaneously adjusting certain inductances in the antenna circuit, the radio frequency amplifier and the oscillator circuit of a television receiver. Each switch section includes tapped inductance elements mounted on a stationary insulating wafer, and a rotary tap-changing switch element cooperates with these inductance elements for tuning purposes. The tuning inductance element for the low-band television channels is a coiled conductor consisting of series-connected coils that are disposed intermediate the taps on this conductor. The tuning inductance element for the high-band television channels is a conductive segment with taps at various points thereon along its length. In addition to these tuning inductance elements, the switch wafer in the antenna section also supports a pair of coupling inductance elements in the form of tapped bus bars, which provide optimum coupling impedances for the low-band channels and the high-band channels. The same rotary switch element serves to change taps on both the coupling inductance elements and the tuning inductance elements in the antenna circuit. The tapped segments and the tapped bus bars are alike in that each utilizes the inherent inductance of a linear conductor, and they may be regarded broadly as "linear conductors" or "bar conductors" to distinguish them from the coiled conductors that are used as tuning inductance elements in the low band.

Referring now to Fig. 1, the tuner is constructed as a three-section, rotary, tap-changing switch comprising an antenna section 15 (Figs. 4 and 5), a radio frequency section 16 (Fig. 3) and an oscillator section 17 (Fig. 2). These switch sections have annular insulating wafers 20, 21 and 22, respectively, that are stationarily supported by long studs or posts 25 on which suitable spacers are disposed to maintain the switch wafers in fixed relation. The studs 25 are secured in a stationary detent plate 26, Fig. 1, with which a rotatable ball detent 27 cooperates. The rotatable detent 27 is mounted on a hollow shaft 30 which extends the entire length of the tuner. The shaft 30 is journaled in a bushing 31 adapted to be mounted on a suitable supporting panel 32. A control knob 33 is secured to the shaft 30 for turning the same, and the detent 27 positions the shaft 30 at definite steps in its rotative movement. A shield plate 34 mounted on the posts 25 is interposed between the antenna section 15 and the radio frequency section 16 of the tuner to prevent stray coupling between these sections.

Rotatably mounted within the shaft 30 is a vernier shaft 36 on which a small control knob 37 is mounted concentric with the larger control knob 33. The other end of the inner shaft 36 is secured to a rotatable capacitor plate 38 which is part of a trimmer capacitor 40 (see Fig. 6) in the oscillator circuit. The capacitor 40 also includes a stationary arcuate plate 42 supported by the switch wafer 22. A bent spring wire 43 anchored on one of the studs 25 grounds the rotatable capacitor plate 38 to the frame of the switch and also functions as a friction brake to prevent the plate 38 from turning when the shaft 30 is turned to change the setting of the tuner. The vernier knob 37 which actuates the trimmer plate 38 is employed for fine tuning purposes.

The illustrated tuner is designed to accommodate the standard television broadcast channels 2 to 13, inclusive. Accordingly, each of the switch wafers 20, 21 and 22 is provided with a series of terminals which are numbered 2 to 13, inclusive. In accordance with the invention, these terminals constitute taps for certain inductance elements (which will be described in detail presently), and any set of like-numbered terminals in the various switch sections may be selected by adjustment of the channel-selecting knob 33.

Considering first the antenna section 15 of the tuner, Figs. 4 and 6, the terminals 7 to 13, inclusive, on the insulating wafer 20 are secured to small tongue-like radial projections 45 on an arcuate conductive segment 46 which is of approximately semicircular configuration. The segment 46 is cut out as indicated at 47, Fig. 4, to avoid electrical contact with the post 25. The segment 46 is a linear conductor having portions intermediate the terminals 7 to 13 of such shape and size as to afford predetermined amounts of inductance. The various inductances which exist in the segment 46 intermediate the terminals 7 to 13 are represented as coils (in broken lines), Fig. 6. The segment 46 is instrumental in tuning the antenna circuit for channels in the high band. For low-band operation, coils 50 to 54 are employed. These coils are series-connected and preferably are formed as parts of a continuous copper wire. The coiled portion 50 of this conductor is soldered at one end thereof to a stationary contact 55 which is anchored by the terminal 2 to the wafer 20, and at its other end the coil 50 is soldered to a stationary contact 56 anchored by the terminal 3 to the wafer 20. Each of the terminals 3 to 13, inclusive, is secured in like fashion to a stationary contact 56, and each of the coil sections 51, 52, 53 and 54 is soldered at opposite ends thereof to a pair of such contacts.

The stationary contact 55 for the terminal 2 is long enough to contact a conductive ring 60 mounted upon a rotary insulating disc 61 in the antenna section 15 of the tuner, this disc 61 being keyed to the shaft 30 for rotation therewith. The stationary contacts 56 are shorter and do not engage the ring 60, but they are cooperable with a tail or tongue 62 projecting radially from the ring 60. As the shaft 30 is turned, the tongue 62 may be brought successively into engagement with the various short contacts 56, thereby establishing an electrical connection (through the ring 60 and the contacts 55 and 56) between the terminal 2 and any other terminal.

Fig. 6 illustrates the manner in which the tuning inductance elements of the antenna section 15 are connected to the associated electrical circuits. The antenna circuit includes terminals 65, 66 and 67 which are connected to a coil composed of portions 68 and 69, with the coil portion 68 being connected between the terminals 65 and 66, and the coil portion 69 being connected between the terminals 66 and 67. The coil portion 68 provides a proper impedance match for a 75-ohm coaxial unbalanced lead-in and the entire coil extending between terminals 65 and 67 provides an optimum matching impedance for a 300-ohm balanced transmission line. The coil portions 68 and 69 cooperate with capacitors 70 and 71 and a resistor 72 to afford a suitable input filter which rejects signals having frequencies outside of the desired range. The output side of this filter is connected by a conductor 73 (which may be a shielded line) to the terminal 2 in the antenna section 15 of the tuner.

The terminal 2 in the section 15 is connected to one end of the coil 50, as mentioned above, and it is also connected electrically to one end of an arcuate bus bar 75, Figs. 5 and 6. For the greatest part of its extent, the bus bar 75 is disposed on the side of the switch wafer 20 which is opposite to the side on which the various tuning coils 50 to 54 are mounted. Short contacts 78 are anchored by the terminals 4 and 6 to the switch wafer 20 but are insulated from the contacts 56 on the opposite side of the wafer. These contacts 78 are soldered respectively to two intermediate points on the bus bar 75, as indicated at 79 and 80, Fig. 5. The bus bar 75 terminates in a soldered connection to a lug 81 that is grounded to one of the posts 25.

The bus bar 75 constitutes a coupling inductance element for the low band. A similar bus bar 83, together with the bus bar 75, provides the coupling inductance for the high band. The bus bar 83 is soldered at one end thereof to a short contact 78 that is secured by the terminal 8 to the wafer 20 but insulated from the contact 56 on the opposite side of this terminal. The other end of the bus bar 83 is soldered to a ground lug 85 on one of the posts 25. The bus bar 83 also has intermediate soldered connections to a short contact 78 extending from the terminal 10 and a long contact 86 extending from the terminal 12, as indicated at the points 87 and 88, Fig. 5. These contacts 78 and 86 are insulated from the contacts 56 on the opposite side of the wafer.

A rotary contact 90, Figs. 5 and 6, secured to the rotary insulating disc 61 has a main body portion that is adapted to cooperate selectively with the short contacts 78, and this contact 90 also has a tail or extension 91 thereon which cooperates only with the long contact 86. The rotary contact 90 and the conductive ring 60 on the opposite side of the rotary switch element are connected together electrically, as indicated by the broken line in Fig. 6, and both are connected to the conductor 73. The terminal 13, which serves as the output terminal of the antenna section 15, is coupled by a conductor 93 and a blocking capacitor 94 to the control grid 95 of the radio frequency amplifier tube 96.

The desired television channel is selected by adjustment of the control knob 33, Fig. 1, which turns the shaft 30 and the rotary switch elements mounted thereon. In the antenna circuit such rotation of the switch serves to adjust both the coupling inductance and the tuning inductance. When the tuner is set for receiving signals in channel No. 2, for example, as shown in Fig. 6, the entire length of the bus bar 75 acts as a coupling inductance. The tuning inductance, under these conditions, constitutes all of the coils 50 to 54 and the additional inductance of the segment 46. If the tuner shaft is now moved to the position which corresponds to television channel No. 3, the rotary tongue 62 cooperates with the stationary contact for terminal 3, and the rotary contact 80 cooperates with the stationary contact 78 for the terminal 4 (this latter contact being engaged by the contact 80 for either of the channels 3 or 4). As a result of this, the tuning coil 50 is short-circuited, and only that portion of the bus bar extending between the terminal 4 and ground acts as a coupling inductance.

As the tuner is switched to higher and higher channels, the tuning inductance and coupling inductance are progressively reduced. Commencing with channel 7, all of the tuning coils 50 to 54 are short-circuited, and the tuning inductance is confined to all or a selected portion of the segment 46, depending upon the channel which is being received. In a similar manner, the coupling inductance comprises all or a selected portion of the bus bar 83 in parallel with the bus bar 75 for the higher channels (from 7 to 13), depending upon the tuner setting. In this way the optimum amount of coupling impedance is inserted in the antenna circuit. Where the same coupling impedance is employed for several adjacent channels, the value thereof is made optimum for all of these channels.

In the radio frequency section 16 of the tuner there are employed the same general types of tuning inductance elements that were used in the antenna circuit. Thus, referring to Figs. 3 and 6, the low-band tuning inductance element is a continuous coiled conductor having coil portions 96 to 100 with taps and stationary contacts that are secured respectively to the terminals 2 to 7. A linear conductor consisting of a conductive segment 101 has taps along its length at the terminals 7 to 13 inclusive. A bypass capacitor 104 is connected between the terminal 2 and ground. The terminal 2 also is connected through a dropping resistor 105 to a source of positive plate voltage. The terminal 13 of the tuner section 16 is connected through the inductor 108 to the plate 110 of the radio frequency amplifier tube 96. The plate 110 is coupled through a conductor 111 and a blocking capacitor 112 to the control grid 113 of the mixer tube 114 in the converter stage.

The coils 96 to 100 and the linear inductance element 101, together with the inductor 108, afford a variable inductance plate load for the amplifier tube 96. Radio frequency signals which are selected by the antenna circuit and then amplified by the tube 96 are further selected by this radio frequency tuning means before passing to the mixer tube 114, thereby affording a high degree of selectivity. After the mixer tube 114 the radio frequency signals are mixed with local oscillations which are furnished by the oscillator circuit of the receiver. The resulting intermediate frequency signals pass through an output transformer 115 to the intermediate frequency amplifier (not shown).

The oscillator switch section 17 is ganged with the antenna and radio frequency sections 15 and 16. Like these other sections, the section 17 has a coiled tuning inductance element consisting of the series-connected coils 120, 121, 122, 123 and 124, and a linear inductance element consisting of the tapped segment 125, to which is added the inductance of the inductor 127. The terminal 2 is connected to ground, as shown in Fig. 6, and the terminal 13 is connected through the inductor 127 and a capacitor 128 to the control grid 130 of the oscillator tube 131. As shown in Fig. 1, the inductor 127 is connected between an end of the segment 125 and a dummy terminal 129 which acts as a circuit tie point. The terminal 129 is electrically connected to the stationary plate 42 of the trimmer 40.

The tuner section 17 operates in the same fashion as the tuner sections 15 and 16 insofar as the manner of varying the tuning inductance is concerned. As the rotary element of the switch is turned, the total effective length of the series-connected inductance elements (coils 120 to 124 and segment 125) is varied, thereby causing the frequency of the local oscillations to vary. These locally generated signals are applied through a capacitor 135 to the grid 113 of the mixer tube 114. At this point the local oscillations are mixed with the radio frequency signal to provide the intermediate frequency signal, as explained above. The details of the various tube circuits employed herein are not fully described since they are only indirectly related to the invention which is being claimed.

The disclosed tuner construction is simple, compact and inexpensive. The number of possible frequency channels which can be accommodated is limited only by the number of terminals that can be mounted on the stationary switch elements, allowing adequate space for the various inductance elements which are inserted between these terminals. All inductance elements are mounted directly on the switch wafers. In addition to the tuning inductance elements, the switch wafer in the antenna section also supports the bus bar coupling inductance elements 75 and 83. Various other advantages of the illustrated construction not specifically enumerated herein may occur to those skilled in the art.

While there has been described what is considered to be a preferred embodiment of the invention, it will be understood that various modifications thereof may be made within the true spirit and scope of the invention as defined in the appended claims.

I claim:

1. Variable inductance means for a television tuner comprising an annular insulating member, a plurality of circumferentially spaced terminals mounted on said insulating member, a linear conductor mounted on said insulating member and having electrical connections to certain of said terminals at various points along the length of said conductor, with the portions of said linear conductor defined by said terminals having predetermined amounts of inductance depending upon the dimensions thereof, a second conductor supported by said insulating member and having a series of coil portions therein along the length thereof, said coil portions respectively being connected to certain of said terminals and having predetermined amounts of inductance, a plurality of stationary contacts supported by said insulating member and respectively connected to all of said terminals, a rotary contact element disposed centrally of said insulating member and cooperating selectively with said stationary contacts, and conductive means for connecting both of said conductors and said rotary contact element in an electric circuit, with said linear conductor and said second conductor affording variable amounts of inductance for such circuit depending upon the setting of said contact element.

2. Variable inductance means for a television tuner comprising a linear conductor having a plurality of taps positioned along the length thereof, with the portions of said linear conductor defined by said taps having predetermined values of inductance depending upon the dimensions thereof, first terminal means connected to said linear conductor, a second conductor having series-arranged coil portions therein to afford predetermined amounts of inductance, said second conductor being connected in series with said linear conductor and having a plurality of taps positioned along the length thereof, second terminal means connected to said second conductor, and tap-changing switch means cooperating selectively with the taps on both of said conductors to place a selected amount of inductance between said first terminal means and said second terminal means.

3. Variable inductance means for a television tuner comprising an annular insulating member, a plurality of terminals mounted on said insulating member, a pair of linear conductors of different sizes mounted on said insulating member and having electrical connections to said terminals at various points on said conductors, with the portions of said linear conductors defined by said terminals having predetermined amounts of inductance depending upon the dimensions thereof, stationary contacts supported by said insulating member and respectively connected to said terminals, a rotary contact element disposed centrally of said insulating member and cooperating selectively with said stationary contacts, and conductive means for connecting said linear conductors and said rotary contact element in an electric circuit, with said linear conductors affording variable amounts of inductance for such circuit depending upon the setting of said contact element.

4. Means for tuning the antenna circuit of a television receiver and for coupling the tuned antenna circuit to the first amplifier stage of the receiver, such means comprising a rotary switch having a stationary insulating wafer and a rotatable contact element, elongated tuning inductance elements mounted on said wafer, taps on said tuning inductance elements defining various amounts of inductance therein, said rotatable contact element cooperating with said taps for selectively tuning the antenna circuit, a coupling element including a linear conductor mounted on said insulating wafer, and taps on said linear conductor defining portions of said linear conductor having predetermined amounts of inductance depending upon the respective lengths of said portions, said rotatable contact element also cooperating with the last-mentioned taps for determining the effective inductance of said coupling element.

5. Means for tuning the antenna circuit of a television receiver and for coupling the tuned antenna circuit to the first amplifier stage of the receiver, such means comprising a rotary switch having a stationary insulating wafer and a rotatable contact element, an elongated tuning inductance element mounted on said wafer, taps on said tuning inductance element defining various amounts of inductance therein, said rotatable contact element cooperating selectively with said taps for tuning the antenna circuit to a desired frequency, coupling means including a pair of bus bars mounted on said insulating wafer, and taps on each of said bus bars defining portions of such bar having predetermined amounts of inductance depending upon the respective lengths of such portions, said rotatable contact element also cooperating selectively with the taps on said bus bars for determining the effective inductance of said coupling means.

6. Means for tuning the antenna circuit of a television receiver and for coupling the tuned antenna circuit to the first amplifier stage of the receiver, such means comprising a rotary switch having a stationary insulating wafer and a rotatable contact element, an elongated tuning inductance element mounted on said wafer, taps on said tuning inductance element defining various amounts of inductance therein, said rotatable contact element cooperating selectively with said taps for tuning the antenna circuit to a desired frequency, coupling means including a pair of bus bars mounted on said insulating wafer, one of said bus bars being electrically connected at one end thereof to an end of said tuning inductance element and being electrically connected at the other end thereof to one end of the second bus bar, and taps on each of said bus bars defining portions of such bar having predetermined amounts of inductance depending upon the respective lengths of such portions, said rotatable contact element also cooperating selectively with the taps on said bus bars for determining the effective inductance of said coupling means, with said one bus bar being in parallel with at least a portion of said second bus bar when said contact element is cooperating with the taps on said second bus bar.

7. Variable inductance means for a multi-stage tuner in a television receiver, said means comprising a first linear conductor having a plurality of taps positioned along the length thereof, with the portions of said first conductor defined by said taps having predetermined values of inductance depending upon the dimensions thereof, a second linear conductor having a plurality of taps positioned along the length thereof, with the portions of said second conductor defined by said taps having predetermined values of inductance depending upon the dimensions thereof, a third conductor having series-arranged coil portions therein to afford a plurality of inductance elements, said third conductor having a plurality of taps positioned along the length thereof, a unitary rotatable switch element having one portion cooperating selectively with the taps on said first and third conductors and another portion cooperating respectively with the taps on said second conductor, both of said portions being electrically interconnected, conductive means for connecting said first and third conductors in a tuning circuit for one stage of the receiver, and other conductive means for connecting said second conductor in a coupling circuit between two stages of the receiver.

8. Variable inductance means for a television tuner including in combination, an annular insulating member, a plurality of circumferentially spaced stationary contacts mounted on said insulating member, an elongated flat conducting sheet mounted on said insulating member having integral terminal portions extending therefrom at various points along the length thereof, with the portions of said elongated conducting sheet extending between said terminal portions having predetermined amounts of inductance, means connecting said terminal portions to said stationary contacts, a rotary contact element disposed substantially centrally of said insulating member and cooperating selectively with said stationary contacts, and conducting means for connecting said conducting sheet and said rotary contact element in an electric circuit, with said conducting sheet affording a variable amount of inductance for said circuit depending upon the setting of said rotary contact element.

9. Variable inductance means for a television tuner including in combination, an insulating member having an opening therein, a plurality of stationary contacts mounted on said insulating member and spaced about said opening, an arcuate shaped flat conducting member mounted on said insulating member and having integral terminal portions extending radially inwardly therefrom at various portions along the length thereof, with the portions of said conducting member defined by said terminal portions having predetermined amounts of inductance, said terminal portions being connected to said stationary contacts, a rotary contact element disposed substantially centrally within said opening in said insulating member and including conducting portions cooperating selectively with said stationary contacts for shorting out portions of said conducting member and means connecting said conducting member in an electric circuit so that a variable amount of inductance is provided in said circuit depending upon the setting of said rotary contact element.

10. Variable inductance means for a television tuner including in combination, a rotary switch having a stationary insulating wafer with an opening therein, a rotary contact element within said opening, and a plurality of fixed contacts spaced circumferentially about said opening on either side of said wafer, inductance means supported on one side of said wafer including a linear conductor having taps thereon defining inductance portions and including a plurality of coil portions connected in series with said linear conductor, means connecting said taps and said coil portions to said stationary contacts on said one side of said wafer, a pair of bus bars mounted on said insulating wafer on the side thereof opposite to said one side and having taps thereon connected to said fixed contacts on said opposite side, and circuit means connecting said inductance means and one of said bus bars in an electric circuit, said rotary contact element including conducting portions for selectively engaging said fixed contacts for shorting out certain of said inductance portions and said coil portions of said inductance means, and for selectively shorting out portions of said one bus bar and connecting portions of the other one of said bus bars in parallel with said one bus bar.

11. Variable inductance means for a television tuner including in combination, a rotary switch having a stationary insulating wafer with an opening therein, a rotary contact element within said opening, and a plurality of fixed contacts spaced circumferentially about said opening on either side of said wafer, inductance means including an elongated flat conductor having integral terminal portions thereon defining inductance portions therebetween and including a plurality of coil portions connected in series with said elongated conductor, means connecting said terminal portions and said coil portions to said stationary contacts on said one side of said wafer for supporting said elongated conductor and said coil portions and making electrical connections thereto, a pair of bus bars mounted on said insulating wafer on the side thereof opposite to said one side and having taps thereon connected to said fixed contacts on said opposite side, and circuit means connecting said inductance means and one of said bus bars in an electric circuit, said rotary contact element including conducting portions for selectively engaging said fixed contacts on both sides of said wafer with the conducting portion engaging said fixed contacts on said one side of said wafer selectively shorting out said inductance portions and said coil portions of said inductance means, and said conducting portion engaging said fixed contacts on said opposite side of said wafer selectively shorting out portions of said one bus bar and connecting portions of the other one of said bus bars in parallel with said one bus bar.

RAYMOND R. WINGERT.

REFERENCES CITED

The following references are of record in the file of this patent:

UNITED STATES PATENTS

| Number | Name | Date |
|---|---|---|
| 1,768,251 | Heising | June 24, 1930 |
| 1,982,751 | Millen | Dec. 4, 1934 |
| 2,078,908 | Harrison | Apr. 27, 1937 |
| 2,408,896 | Turner | Oct. 8, 1946 |
| 2,497,747 | Valdettarro | Feb. 14, 1950 |

FOREIGN PATENTS

| Number | Country | Date |
|---|---|---|
| 615,106 | Great Britain | Jan. 3, 1949 |